US009003341B2

(12) United States Patent
Yu et al.

(10) Patent No.: US 9,003,341 B2
(45) Date of Patent: Apr. 7, 2015

(54) METHOD FOR DETERMINING INTERFACE TIMING OF INTEGRATED CIRCUIT AUTOMATICALLY AND RELATED MACHINE READABLE MEDIUM THEREOF

(71) Applicant: Realtek Semiconductor Corp., HsinChu (TW)

(72) Inventors: Mei-Li Yu, Taoyuan County (TW); Ting-Hsiung Wang, Kaohsiung (TW); Yu-Lan Lo, Hsinchu County (TW); Shu-Yi Kao, Hsinchu County (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 14/051,455

(22) Filed: Oct. 11, 2013

(65) Prior Publication Data

US 2014/0223398 A1     Aug. 7, 2014

(30) Foreign Application Priority Data

Feb. 7, 2013   (TW) .............................. 102104847 A

(51) Int. Cl.
    *G06F 17/50*      (2006.01)
    *G06F 1/10*       (2006.01)
(52) U.S. Cl.
    CPC .............. *G06F 1/10* (2013.01); *G06F 17/5031* (2013.01)

(58) Field of Classification Search
    USPC ................. 716/100–108, 110–113, 118, 126
    See application file for complete search history.

(56) References Cited

U.S. PATENT DOCUMENTS

| 5,956,257 | A  | * | 9/1999 | Ginetti et al. ................. 716/103 |
| 6,058,252 | A  | * | 5/2000 | Noll et al. ...................... 716/113 |
| 8,543,951 | B2 | * | 9/2013 | Rao et al. ...................... 716/108 |
| 2012/0095746 | A1 |  | 4/2012 | Rao |

FOREIGN PATENT DOCUMENTS

TW             576997          2/2004

* cited by examiner

*Primary Examiner* — Nghia Doan
(74) *Attorney, Agent, or Firm* — Winston Hsu; Scott Margo

(57) ABSTRACT

A method for determining an interface timing of an integrated circuit includes: reading a netlist file and a timing constraint file of the integrated circuit, and determining a first interface port of the netlist file according to the netlist file and the timing constraint file; determining a first transmission path and a load on the first transmission path between the first interface port and a specific circuit element in the netlist file; generating an interface circuit file according to the first transmission path and the load on the first transmission path; and calculating a first signal transmission time of the first transmission path out according to the interface circuit file.

19 Claims, 12 Drawing Sheets

US 9,003,341 B2

METHOD FOR DETERMINING INTERFACE TIMING OF INTEGRATED CIRCUIT AUTOMATICALLY AND RELATED MACHINE READABLE MEDIUM THEREOF

BACKGROUND OF THE INVENTION

1. Field of the Invention

The disclosed embodiments of the present invention relate to a method for determining an interface timing of an integrated circuit, and more particularly, to a method for determining an interface timing of an integrated circuit automatically and related machine readable medium thereof.

2. Description of the Prior Art

In the field of integrated circuit design, when the design of a circuit module with a specific function is completed, the process is usually followed by integrating the circuit module into a circuit system. In other words, the circuit module is implemented to receive signals from one external circuit module and transmit signals to another external circuit module. In order to make the signal and clock transmission between the circuit module and the external circuit modules work correctly, the interface timing constraint between modules becomes a highly concerned issue of chip developers. However, along with the advance of the integrated circuit technology, more and more functions are integrated into a single chip. To put it another way, the chip developers have to spend a longer simulation time for arranging the chip interface timing. As a result, the chip development time is too long to have good product competitiveness for the chip developer. Therefore, how to determine the interface timing of a chip in a fast and accurate way has become an urgent issue in the field of the integrated circuit design.

SUMMARY OF THE INVENTION

Therefore, one of the objectives of the present invention is to provide a method for determining interface timing of an integrated circuit automatically and related machine readable medium thereof.

According to a first embodiment of the present invention, a method for determining an interface timing of an integrated circuit is disclosed. The method includes: reading a netlist file and a timing constraint file of the integrated circuit, and determining a first interface port of the netlist file according to the netlist file and the timing constraint file; determining a first transmission path and a load on the first transmission path between the first interface port and a specific circuit element in the netlist file; generating an interface circuit file according to the first transmission path and the load on the first transmission path; and calculating a first signal transmission time of the first transmission path out according to the interface circuit file.

According to a second embodiment of the present invention, an exemplary non-transitory machine readable medium is disclosed. The non-transitory machine readable medium stores a program code, wherein when executed by a processor, the program code enables the processor to perform following steps: reading a netlist file and a timing constraint file of the integrated circuit, and determining a first interface port of the netlist file according to the netlist file and the timing constraint file; determining a first transmission path and a load on the first transmission path between the first interface port and a specific circuit element in the netlist file; generating an interface circuit file according to the first transmission path and the load on the first transmission path; and calculating a first signal transmission time of the first transmission path out according to the interface circuit file.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
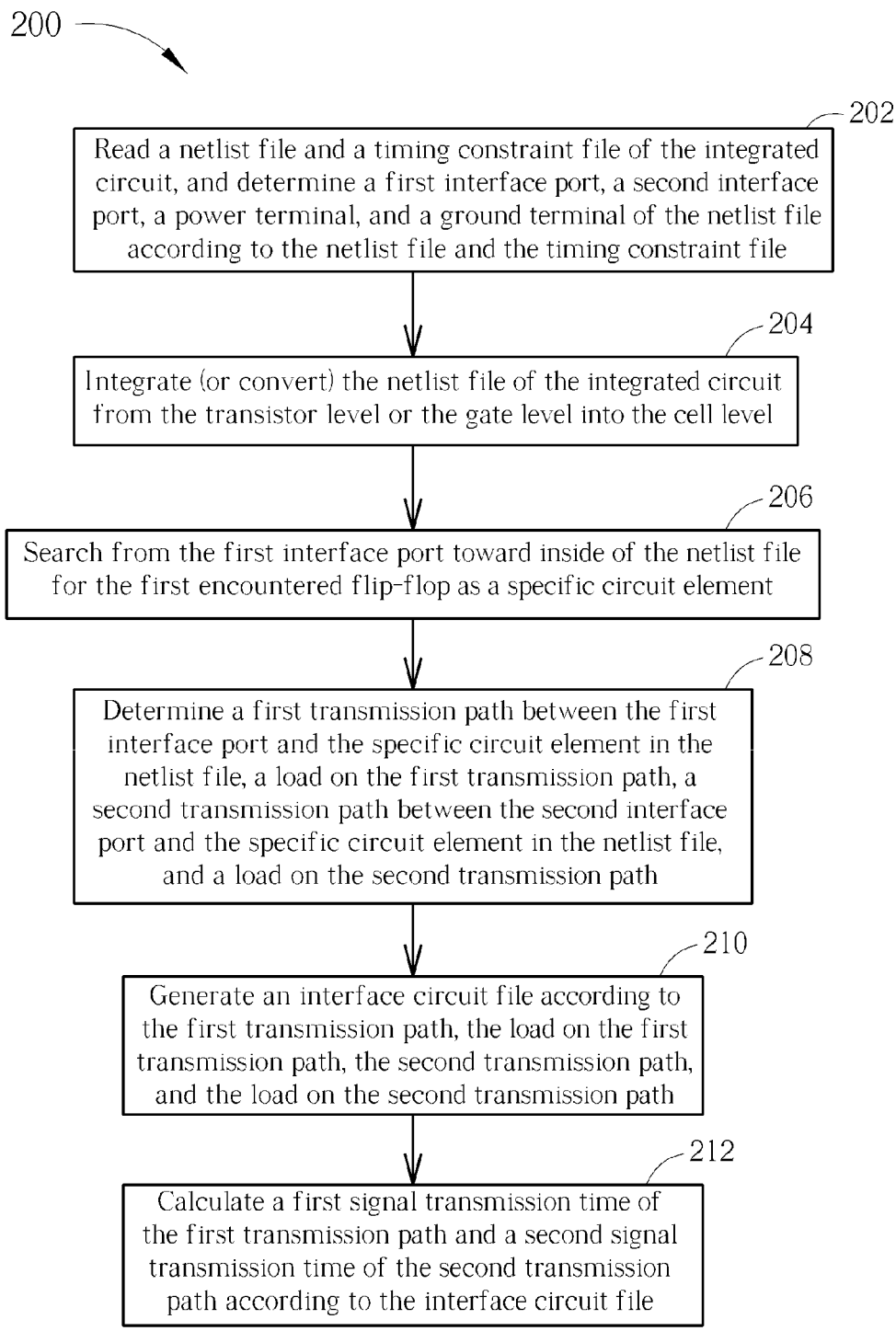
FIG. 1 is a flowchart illustrating a method for determining an interface timing of an integrated circuit according to a first embodiment of the present invention.
Figure 2:
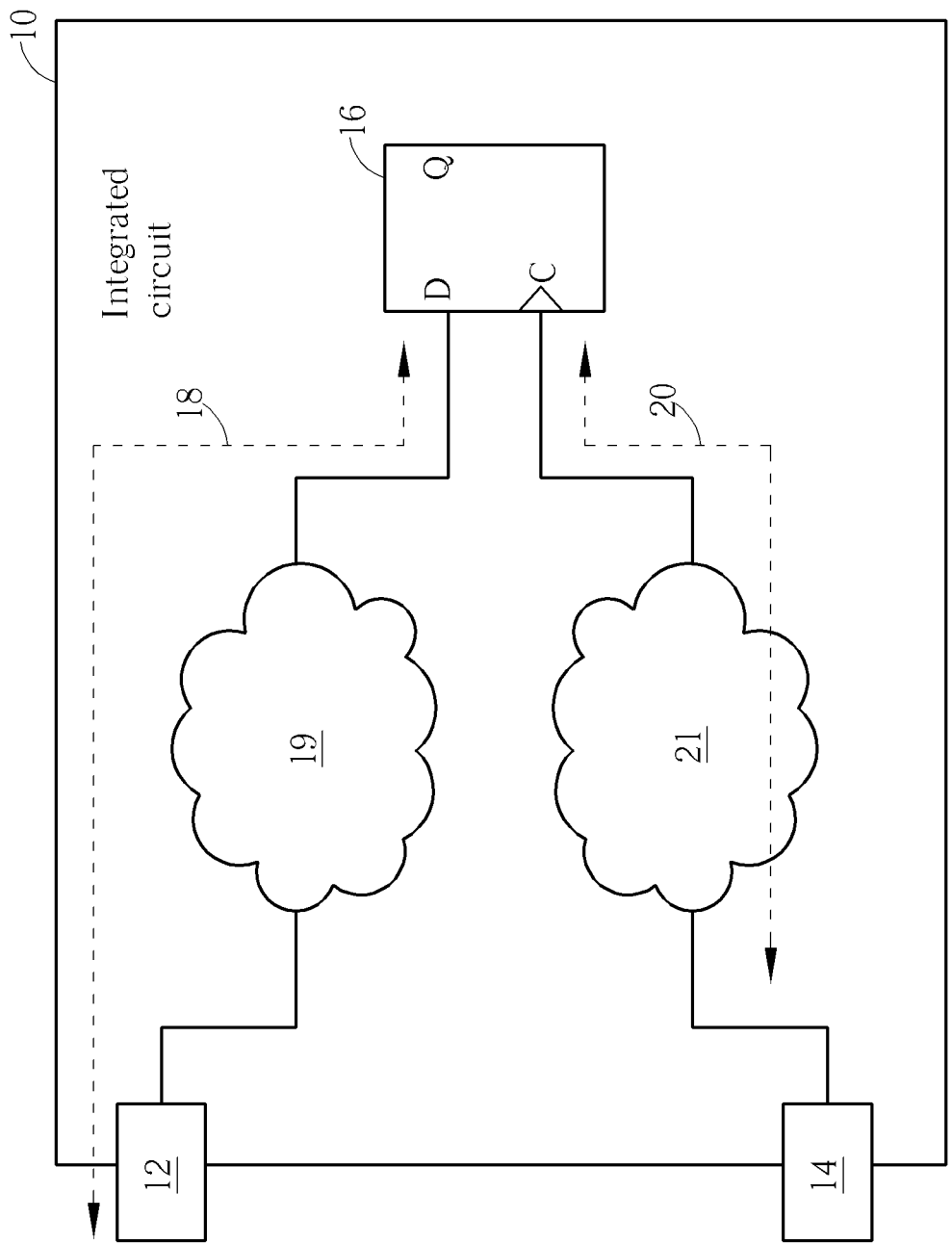
FIG. 2 is a diagram illustrating the integrated circuit according to an exemplary embodiment of the present invention.

Please refer to FIG. 1 and FIG. 2. FIG. 1 is a flowchart illustrating a method 200 for determining an interface timing of an integrated circuit 10 according to a first embodiment of the present invention. FIG. 2 is a diagram illustrating the integrated circuit 10 according to an exemplary embodiment of the present invention. Please note that, for the sake of simplicity, FIG. 2 only shows a first signal input port 12, a second signal input port 14, a flip-flop 16, a first transmission path 18 where a data signal passes from the first signal input port 12 to the flip-flop 16, a load 19 on the first transmission path 18, a second transmission path 20 where a clock signal passes from the second signal input port 14 to the flip-flop 16, and a load 21 on the second transmission path 20 of the integrated circuit 10, wherein the load 19 is regarded as induced by the branch circuit paths along the first transmission path 18, and the load 21 is regarded as induced by the branch circuit paths along the second transmission path 20. Moreover, it should be noted that all the loads mentioned hereinafter could be regarded as induced by the branch circuit paths along the main transmission path. In addition, for the sake of simplicity, each transmission path shown in the following drawings will be indicated by a broken line ended with arrow symbols. Provided that substantially the same result is achieved, the steps in FIG. 1 need not be in the exact order shown and need not be contiguous, that is, other steps can be intermediate. Besides, some steps in FIG. 1 may be omitted according to various types of embodiments or requirements. In this embodiment, the method 200 includes the following steps.

Step 202: Read a netlist file 22 and a timing constraint file 24 of the integrated circuit 10, and determine a first interface port, a second interface port, a power terminal, and a ground terminal of the netlist file 22 according to the netlist file 22 and the timing constraint file 24;

Step 204: Integrate (or convert) the netlist file 22 of the integrated circuit 10 from the transistor level or the gate level into the cell level;

Step 206: Search from the first interface port toward inside of the netlist file 22 for the first encountered flip-flop as a specific circuit element;

Step 208: Determine a first transmission path between the first interface port and the specific circuit element in the netlist file 22, a load on the first transmission path, a second transmission path between the second interface port and the specific circuit element in the netlist file 22, and a load on the second transmission path;

Step 210: Generate an interface circuit file 26 according to the first transmission path, the load on the first transmission path, the second transmission path, and the load on the second transmission path; and Step 212: Calculate a first signal transmission time of the first transmission path and a second signal transmission time of the second transmission path according to the interface circuit file 26.

It should be noted that, in this embodiment, the first signal input port 12 is utilized for receiving a data signal, and the second signal input port 14 is utilized for receiving a clock signal. Hence, the first signal input port 12 and the second signal input port 14 are data pin and clock pin of the integrated circuit 10, respectively. The objective of the method 200 is to obtain the setup/hold time between the first signal input port 12 and the second signal input port 14 of the integrated circuit 10. To put it another way, the method 200 of the present embodiment is utilized to obtain a signal transmission time T1 needed to transmit a data signal from the first signal input port 12 to the first encountered flip-flop 16 in the integrated circuit 10, and a clock transmission time T2 needed to transmit a clock signal from the second signal input port 14 to the flip-flop 16 in the integrated circuit 10. Therefore, the first interface port, the second interface port, the first transmission path, the second transmission path, the first flip-flop, the first signal transmission time, and the second signal transmission time mentioned in the steps of the method 200 could be regarded as the first signal input port 12, the second signal input port 14, the first transmission path 18, the second transmission path 20, the flip-flop 16, the signal transmission time T1, and the clock transmission time T2 of the integrated circuit 10, respectively.

First of all, in step 202, the method 200 of the present invention loads and reads the netlist file 22 and the timing constraint file 24 of the integrated circuit 10 to obtain a power terminal, a ground terminal, and the first signal input port 12 as well as the second signal input port 14, which need to be calculated for the setup/hold time, from the netlist file 22. Next, according the method 200 of the present invention, the netlist file 22 of the integrated circuit 10 is integrated (or converted) from the transistor level or the gate level into the cell level in step 204 for reducing the complexity of the netlist file 22. Please note that the step of integrating (converting) the netlist file 22 of the integrated circuit 10 from the transistor level or the gate level into the cell level is based on the characteristics of the circuit elements in the netlist file 22 according to the embodiment of the present invention. For instance, transistors or logic gates in the same hierarchy name will be integrated into a cell. In addition, the contents of the timing constraint file 24 include: 1. POWER_ON_RESET sheet, which is inputted into the integrated circuit 10; 2. POWER_PAD sheet, which is inputted into the integrated circuit 10; 3. SIGNAL sheet, which is inputted into the integrated circuit 10; and 4. TIMING_INFO sheet, which is inputted into the integrated circuit 10. Please note that the timing constraint files in the following embodiments also have similar contents.

Then, the method 200 of the present invention searches from the first signal input port 12 toward inside of the netlist file 22 for the first encountered flip-flop (i.e., the flip-flop 16) in the step 206. Please note that the specific circuit element is not limited to the first encountered flip-flop. Those skilled in the art could also designate other circuit element possesses similar function as the specific circuit element. After the first encountered flip-flop is found as the flip-flop 16, the first transmission path 18 between the first signal input port 12 and the flip-flop 16, the load 19 on the first transmission path 18, the second transmission path 20 between the second signal input port 14 and the flip-flop 16, and the load 21 on the second transmission path 20 can therefore be determined in the step 208. As can be seen in FIG. 2, the flip-flop 16 is the element located at intersection of the first transmission path 18 and the second transmission path 20, wherein the first transmission path 18 is coupled to the data terminal D of the flip-flop 16, and the second transmission path 20 is coupled to the clock terminal C of the flip-flop 16. Furthermore, according to the method 200 of the present invention, after the first encountered flip-flop (i.e., the flip-flop 16) is found by searching from the first signal input port 12 toward inside of the netlist file 22, the path between the first signal input port 12 and the data terminal D of the flip-flop 16 is designated as a first candidate path. Next, the method 200 of the present invention backtracks from the data port D of the flip-flop 16 toward the first signal input port 12 for finding out the path coupled between the data port D of the flip-flop 16 and the first signal input port 12, wherein the path is designated as the second candidate path. After the first candidate path and the second candidate path between the first signal input port 12 and the data terminal D of the flip-flop 16 are determined, the method 200 of the present invention designates a common path of the first candidate path and the second candidate path as the first transmission path 18, wherein the load on the common path will be designated as the load 19 on the first transmission path 18. It should be noted that there could be some undesired branch circuit paths along the first candidate path between the first signal input port 12 and the data terminal D of the flip-flop 16, and some undesired branch circuit paths along the second candidate path between the data terminal D of the flip-flop 16 and the first signal input port 12. Hence, through cross-comparing the first candidate path with the second candidate path, the common path is then obtained, thereby concluding the total load seen by an input signal transmitted from the first signal input port 12 to the data port D of the flip-flop 16. Therefore, the actual load seen by the input signal transmitted from the first signal input port 12 to the data terminal D of the flip-flop 16 can be obtained by designating the common path between the first candidate path and the second candidate path as the first transmission path 18, and designating the load on the common path as the load 19 on the first transmission path 18.

Similarly, in step 208, when the method 200 of the present invention searches from the second signal input port 14 toward inside of the netlist file 22 for the flip-flop 16 coupled commonly, the path coupled between the second signal input port 14 and the clock terminal C of the flip-flop 16 is designated as a third candidate path. Next, the method 200 of the present invention backtracks from the clock terminal C of the flip-flop 16 toward the second signal input port 14 for finding out the path coupled between the clock terminal C of the flip-flop 16 and the second signal input port 14, wherein the path is designated as the fourth candidate path. After the third candidate path and the fourth candidate path between the second signal input port 14 and the clock terminal C of the flip-flop 16 are determined, a common path of the third candidate path and the fourth candidate path will be designated as the second transmission path 20, and the load on the common path will be designated as the load 21 on the second transmission path 20 according to the method 200 of the present invention. It should be noted that there could be some undesired branch circuit paths along the third candidate path between the second signal input port 14 and the clock terminal C of the flip-flop 16, and some undesired branch circuit paths along the fourth candidate path between the clock terminal C of the flip-flop 16 and the second signal input port 14. Hence, through cross-comparing the third candidate path with the fourth candidate path, the common path is then obtained, thereby concluding the total load seen by an input signal transmitted from the second signal input port 14 to the clock terminal C of the flip-flop 16. Therefore, the actual load seen by the input signal transmitted from the second signal input port 14 to the clock terminal C of the flip-flop 16 can be obtained by designating the common path between the third candidate path and the fourth candidate path as the second transmission path 20, and designating the load on the common path as the load 21 on the second transmission path 20.

Next, in step 210, after the first transmission path 18, the load 19, the second transmission path 20, and the load 21 are determined, the first transmission path 18, the load 19, the second transmission path 20, and the load 21 are automatically extracted according to the method 200 of the present invention to thereby generate the interface circuit file 26 of the integrated circuit 10. After that, in step 212, the method 200 of the present invention utilizes the simplified interface circuit file 26 for calculating the signal transmission time T1 of the first transmission path 18 and the clock transmission time T2 of the second transmission path 20. Please note that, in step 212, the method 200 of the present invention makes the power terminal and the ground terminal of the simplified interface circuit file 26 connected to the corresponding voltage levels before calculating the signal transmission time T1 of the first transmission path 18 and the clock transmission time T2 of the second transmission path 20. However, this is not a limitation of the present invention.

After the signal transmission time T1 of the first transmission path 18 and the clock transmission time T2 of the second transmission path 20 are calculated, the setup/hold time between the first signal input port 12 and the second signal input port 14 of the interface of the integrated circuit 10 will be obtained accordingly, wherein the detailed calculation process is omitted here for brevity. Thus, an accurate timing model will be established through applying the results of the setup/hold time to the timing model of the integrated circuit 10 by utilizing a specific program after the setup/hold time between the first signal input port 12 and the second signal input port 14 of the interface of the integrated circuit 10 is obtained.

According to the aforementioned embodiment, the method 200 of the present invention utilizes the simplified interface circuit file 26 and a computer for allowing the signal transmission time T1 of the first transmission path 18 and the clock transmission time T2 of the second transmission path 20 to be obtained through simulation. Therefore, compared with the conventional process (e.g., finding out the signal transmission time T1 of the first transmission path 18 and the clock transmission time T2 of the second transmission path 20 from a whole chip simulation accomplished by directly using the entire netlist file 22 of the integrated circuit 10), the method 200 of the present invention calculates the setup/hold time between the first signal input port 12 and the second signal input port 14 of the interface of the integrated circuit 10 faster and more accurately.

Please note that, though the method 200 focuses on the setup/hold time between the first signal input port 12 and the second signal input port 14 of the interface of the integrated circuit 10 in above embodiments, this is not a limitation of the present invention. Alternatively, the chip developer may utilize the transmission time from a data pin of the output interface of the integrated circuit 10 to the first encountered flip-flop, or the transmission time from a clock pin of the output interface of the integrated circuit 10 to a first encountered flip-flop for the setup/hold time calculation process, which also belongs to the scope of the present invention.

Figure 3:
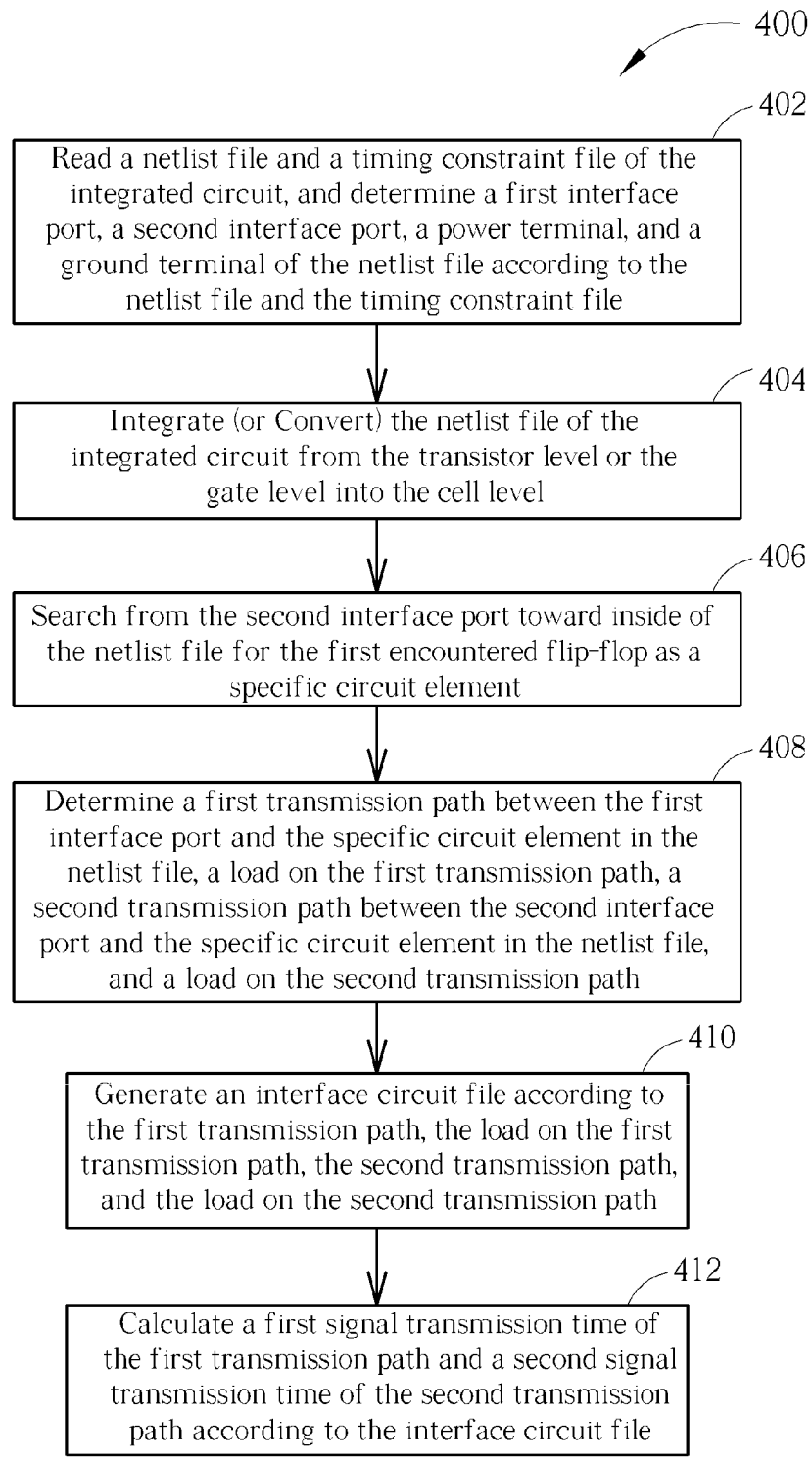
FIG. 3 is a flowchart illustrating a method for determining an interface timing of an integrated circuit according to a second embodiment of the present invention.
Figure 4:
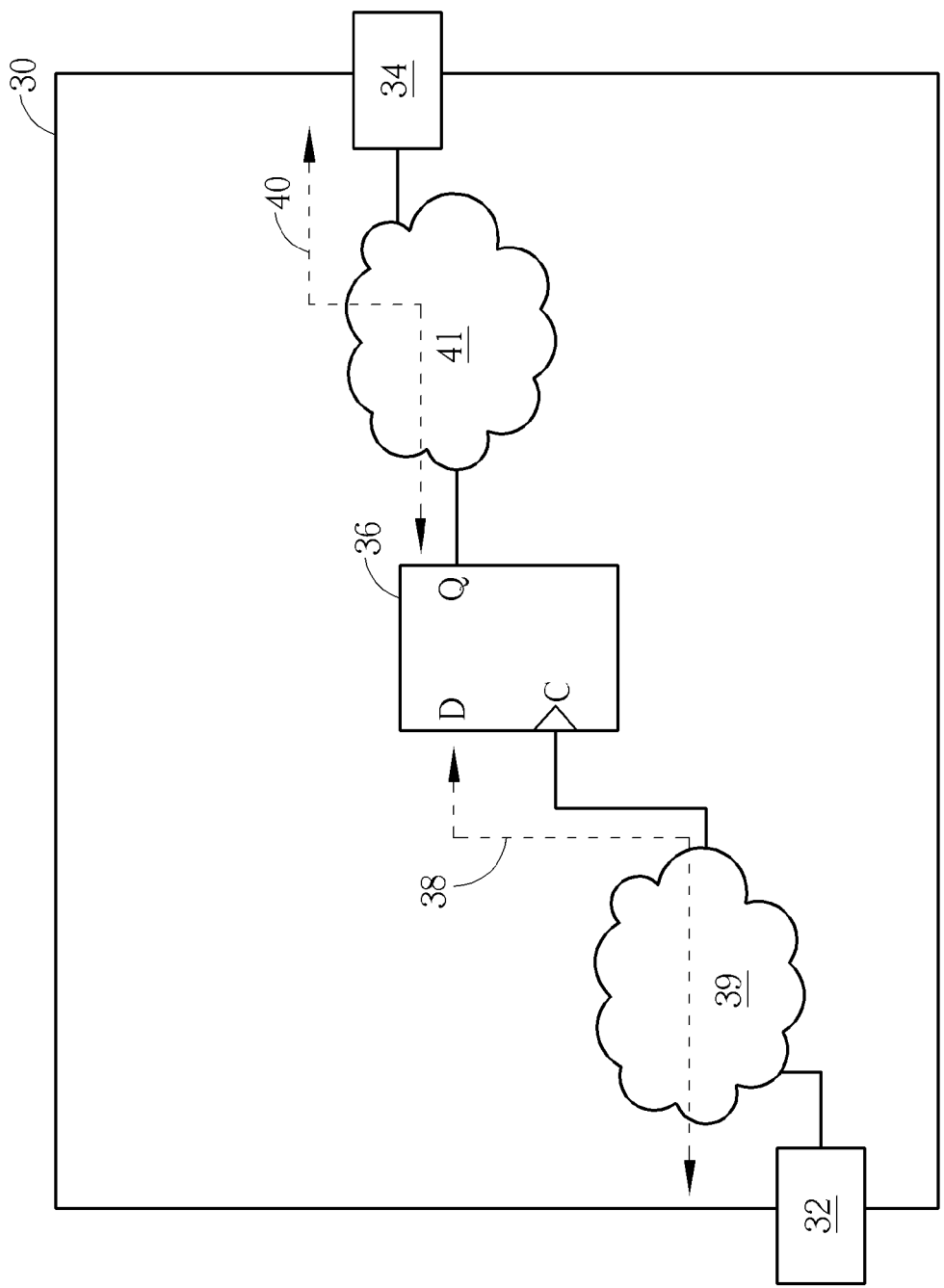
FIG. 4 is a diagram illustrating the integrated circuit according to an exemplary embodiment of the present invention.

Please refer to FIG. 3 and FIG. 4. FIG. 3 is a flowchart illustrating a method 400 for determining an interface timing of an integrated circuit 30 according to a second embodiment of the present invention. FIG. 4 is a diagram illustrating the integrated circuit 30 according to an exemplary embodiment of the present invention. Please note that, for the sake of simplicity, FIG. 4 only shows a signal input port 32, a signal output port 34, a flip-flop 36, a first transmission path 38 where a clock signal passes from the signal input port 32 to the flip-flop 36, a load 39 on the first transmission path 38, a second transmission path 40 where a data signal passes from the signal output port 34 to the flip-flop 36, and a load 41 on the second transmission path 40 of the integrated circuit 30. Provided that substantially the same result is achieved, the steps in FIG. 3 need not be in the exact order shown and need not be contiguous, that is, other steps can be intermediate. Besides, some steps in FIG. 3 may be omitted according to various types of embodiments or requirements. In this embodiment, the method 400 includes the following steps.

Step 402: Read a netlist file 42 and a timing constraint file 44 of the integrated circuit 30, and determine a first interface port, a second interface port, a power terminal, and a ground terminal of the netlist file 42 according to the netlist file 42 and the timing constraint file 44;

Step 404: Integrate (or Convert) the netlist file 42 of the integrated circuit 30 from the transistor level or the gate level into the cell level;

Step 406: Search from the second interface port toward inside of the netlist file 42 for the first encountered flip-flop as a specific circuit element;

Step 408: Determine a first transmission path between the first interface port and the specific circuit element in the netlist file 42, a load on the first transmission path, a second transmission path between the second interface port and the specific circuit element in the netlist file 42, and a load on the second transmission path;

Step 410: Generate an interface circuit file 46 according to the first transmission path, the load on the first transmission path, the second transmission path, and the load on the second transmission path.

Step 412: Calculate a first signal transmission time of the first transmission path and a second signal transmission time of the second transmission path according to the interface circuit file 46.

It should be noted that, according to the present embodiment, the signal input port 32 is utilized for receiving a clock signal, and the signal output port 34 is utilized for outputting a data signal, and therefore the signal input port 32 and the signal output port 34 are clock pin and data pin of the integrated circuit 30 respectively. The objective of the method 400 is to obtain the delay time between the signal input port 32 and the signal output port 34 of the integrated circuit 30. To put it another way, according to the present embodiment, the method 400 is utilized to obtain a clock transmission time T3 needed to transmit the clock signal from the signal input port 32 to the flip-flop 36 of the integrated circuit 30, and a data transmission time T4 needed to transmit the data signal from the flip-flop 36 to the signal output port 34 of the integrated circuit 30. Therefore, the first interface port, the second interface port, the first transmission path, the second transmission path, the first flip-flop, the first signal transmission time, and the second signal transmission time mentioned in the steps of the method 400 could be regarded as the signal input port 32, the signal output port 34, the first transmission path 38, the second transmission path 40, the flip-flop 36, the clock transmission time T3, and the data transmission time T4 of the integrated circuit 30, respectively.

Furthermore, the method 400 of the present invention searches from the signal output port 34 toward inside of the netlist file 42 for the first encountered flip-flop (i.e. the flip-flop 36) in step 406, which is similar to the method of the first embodiment. Please note that the present invention may also search from the signal input port 32 toward inside of the netlist file 42 for the flip-flop 36. After the first encountered flip-flop is found as the flip-flop 36, the first transmission path 38 between the signal input port 32 and the flip-flop 36, the load 39 on the first transmission path 38, the second transmission path 40 between the signal output port 34 and the flip-flop 36, and the load 41 on the second transmission path 40 can therefore be determined in the step 408. As can be seen in FIG. 4, the flip-flop 36 is the element located at intersection of the first transmission path 38 and the second transmission path 40, wherein the first transmission path 38 is coupled to the clock terminal C of the flip-flop 36, and the second transmission path 40 is coupled to the data output terminal Q of the flip-flop 36. Furthermore, according to the method 400 of the present invention, after the first encountered flip-flop (i.e., the flip-flop 36) is found by searching from the signal output port 34 toward inside of the netlist file 42, the path between the signal output port 34 and the data output terminal Q of the flip-flop 36 is designated as a first candidate path. Next, the method 400 of the present embodiment backtracks from the data output terminal Q of the flip-flop 36 toward the signal output port 34 for finding out the path coupled between the data output terminal Q of the flip-flop 36 and the signal output port 34, wherein the path is designated as the second candidate path. After the first candidate path and the second candidate path between the signal output port 34 and the data output terminal Q of the flip-flop 36 are determined, the method 400 of the present embodiment designates a common path of the first candidate path and the second candidate path as the second transmission path 40, and designates the load on the common path as the load 41 on the second transmission path 40. Hence, through cross-comparing the first candidate path with the second candidate path by using the method similar to that employed in the first embodiment, the common path is then obtained, thereby concluding the total load seen by an output signal transmitted from the data output terminal Q of the flip-flop 36 to the signal output port 34.

Similarly, in step 408, the method 400 of the present embodiment searches from the signal input port 32 toward inside of the netlist file 42 for the flip-flop 36 coupled commonly, wherein the path coupled between the signal input port 32 and the clock terminal C of the flip-flop 36 is designated as a third candidate path. Next, the method 400 of the present embodiment backtracks from the clock terminal C of the flip-flop 36 toward the signal input port 32 for finding out the path coupled between the clock terminal C of the flip-flop 36 and the signal input port 32, wherein the path is designated as the fourth candidate path. After the third candidate path and the fourth candidate path between the signal input port 32 and the clock terminal C of the flip-flop 36 are determined, the method 400 of the present embodiment designates a common path of the third candidate path and the fourth candidate path as the first transmission path 38, and designates the load on the common path as the load 39 on the first transmission path 38. Hence, through cross-comparing the third candidate path with the fourth candidate path by using the method similar to the first embodiment, the common path is then obtained, thereby concluding the total load seen by an input signal transmitted from the signal input port 32 to the clock terminal C of the flip-flop 36.

Next, in step 410, after the first transmission path 38, the load 39, the second transmission path 40, and the load 41 are determined, the first transmission path 38, the load 39, the second transmission path 40, and the load 41 are automatically extracted by the method 400 of the present embodiment to generate the interface circuit file 46 of the integrated circuit 30. After that, in the step 412, the method 400 of the present embodiment utilizes the simplified interface circuit file 46 for calculating the clock transmission time T3 of the first transmission path 38 and the data transmission time T4 of the second transmission path 40. After the clock transmission time T3 of the first transmission path 38 and the data transmission time T4 of the second transmission path 40 are calculated, the delay time from the signal input port 32 of the input interface to the signal output port 34 of the output interface of the integrated circuit 30 will be obtained accordingly, wherein the detailed calculation process is omitted here for brevity. Hence, an accurate timing model will be established through applying the results of the delay time to the timing model of the integrated circuit 30 by utilizing a specific program after the delay time between the signal input port 32 of the input interface and the output port 34 of the output interface of the integrated circuit 30 is obtained. In the end, the chip developer will obtain a sufficiently precise timing model.

According to the aforementioned embodiment, the method 400 of the present invention utilizes the simplified interface circuit file 46 and a computer for allowing the clock transmission time T3 of the first transmission path 38 and the data transmission time T4 of the second transmission path 40 to be obtained through simulation. Therefore, compared with the conventional process (e.g., finding out the clock transmission time T3 of the first transmission path 38 and the data transmission time T4 of the second transmission path 40 from a whole chip simulation accomplished by directly using the entire netlist file 42 of the integrated circuit 30), the method 400 of the present invention calculates the delay time between the signal input port 32 of the input interface and the signal output port 34 of the output interface of the integrated circuit 30 faster and more accurately.

Please note that, as steps 402 and 404 are similar to steps 202 and 204 respectively, further details are omitted here for brevity.

Figure 5:
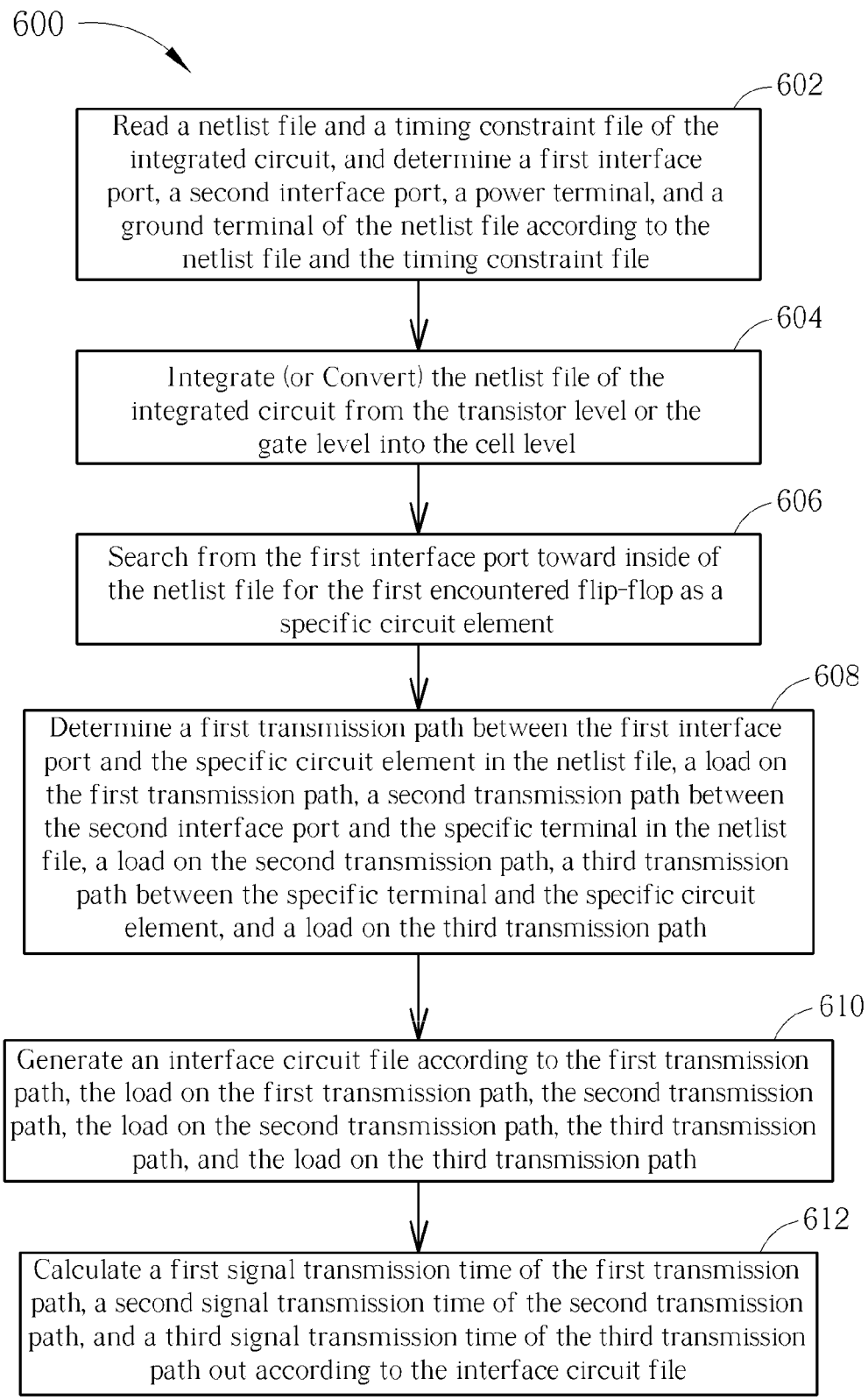
FIG. 5 is a flowchart illustrating a method for determining an interface timing of an integrated circuit according to a third embodiment of the present invention.
Figure 6:
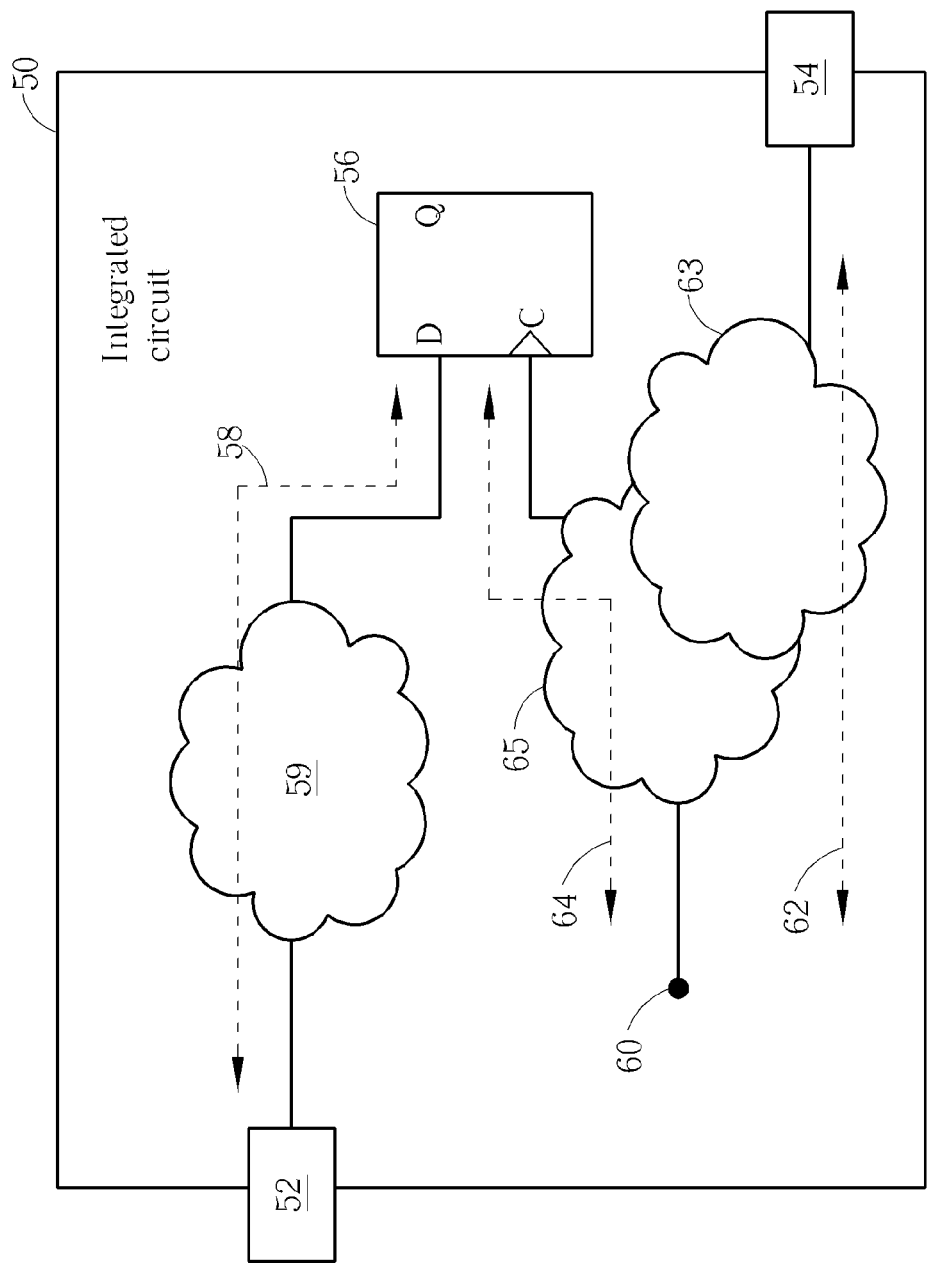
FIG. 6 is a diagram illustrating the integrated circuit according to an exemplary embodiment of the present invention.

Please refer to FIG. 5 and FIG. 6. FIG. 5 is a flowchart illustrating a method 600 for determining an interface timing of an integrated circuit 50 according to a third embodiment of the present invention. FIG. 6 is a diagram illustrating the integrated circuit 50 according to an exemplary embodiment of the present invention. Please note that, for the sake of simplicity, FIG. 6 only shows a signal input port 52, a signal output port 54, a flip-flop 56, a first transmission path 58 where a data signal passes from the signal input port 52 to the flip-flop 56, a load 59 on the first transmission path 58, a second transmission path 62 where a clock signal passes from the signal output port 54 to a specific terminal 60 in the integrated circuit 50, a load 63 on the second transmission path 62, a third transmission path 64 where a clock signal passes from the specific terminal 60 to the flip-flop 56, and a load 65 on the third transmission path 64, wherein the load 63 may partly overlap with the load 65. Provided that substantially the same result is achieved, the steps in FIG. 5 need not be in the exact order shown and need not be contiguous, that is, other steps can be intermediate. Besides, some steps in FIG. 5 may be omitted according to various types of embodiments or requirements. In this embodiment, the method 600 includes the following steps.

Step 602: Read a netlist file 66 and a timing constraint file 68 of the integrated circuit 50, and determine a first interface port, a second interface port, a power terminal, and a ground terminal of the netlist file 66 according to the netlist file 66 and the timing constraint file 68;

Step 604: Integrate (or Convert) the netlist file 66 of the integrated circuit 50 from the transistor level or the gate level into the cell level;

Step 606: Search from the first interface port toward inside of the netlist file 66 for the first encountered flip-flop as a specific circuit element;

Step 608: Determine a first transmission path between the first interface port and the specific circuit element in the netlist file 66, a load on the first transmission path, a second transmission path between the second interface port and the specific terminal in the netlist file 66, a load on the second transmission path, a third transmission path between the specific terminal and the specific circuit element, and a load on the third transmission path;

Step 610: Generate an interface circuit file 69 according to the first transmission path, the load on the first transmission path, the second transmission path, the load on the second transmission path, the third transmission path, and the load on the third transmission path Step 612: Calculate a first signal transmission time of the first transmission path, a second signal transmission time of the second transmission path, and a third signal transmission time of the third transmission path out according to the interface circuit file 69.

It should be noted that, according to the present embodiment, the signal input port 52 is utilized for receiving a data signal, and the signal output port 54 is utilized for outputting a clock signal, and the specific terminal 60 is an internal clock generation terminal in the netlist file 66. In other words, the specific terminal 60 is an output terminal of an internal clock generator (e.g., a phase-locked loop). Therefore, the signal input port 52 and the signal output port 54 are data pin and clock pin of the integrated circuit 50, respectively. The objective of the method 600 is to obtain a signal transmission time T5 needed to transmit the data signal from the signal input port 52 to the flip-flop 56 of the integrated circuit 50, a clock transmission time T6 needed to transmit the clock signal from the specific terminal 60 to the signal output port 54 of the integrated circuit 50, and a clock transmission time T7 needed to transmit the clock signal from the specific terminal 60 to the flip-flop 56 of the integrated circuit 50. Therefore, the first interface port, the second interface port, the first transmission path, the second transmission path, the third transmission path, the first flip-flop, the first signal transmission time, the second signal transmission time, and the third signal transmission time mentioned in the steps of the method 600 could be regarded as the signal input port 52, the signal output port 54, the first transmission path 58, the second transmission path 62, the third transmission path 64, the flip-flop 56, the signal transmission time T5, the clock transmission time T6, and the clock transmission time T7 of the integrated circuit 50, respectively.

Furthermore, in step 606, the method 600 of the present embodiment searches from the signal input port 52 toward inside of the netlist file 66 for the first encountered flip-flop (i.e., the flip-flop 56), which is similar to the method of the first embodiment. After the first encountered flip-flop is found as the flip-flop 56, the first transmission path 58 between the signal input port 52 and the flip-flop 56 in the netlist file 66, the load 59 on the first transmission path 58, the second transmission path 62 between the signal output port 54 and the specific terminal 60 in the netlist file 66, the load 63 on the second transmission path 62, the third transmission path 64 between the specific terminal 60 and the flip-flop 56, and the load 65 on the third transmission path 64 can therefore be determined in the step 608. As can be seen in FIG. 6, since the integrated circuit 50 possesses no external clock signal, the clock used by the integrated circuit 50 is generated from an internal clock generator, wherein the internal clock generator could be based on a data signal received from the data terminal D. To put it another way, the method 600 of the present embodiment searches from the signal output port 54 toward inside of the netlist file 66 for the clock generator in the step 608, and then designates a clock output terminal of the clock generator as the specific terminal 60. Next, the second transmission path 62 between the signal output port 54 and the specific terminal 60 in the netlist file 66, the load 63 on the second transmission path 62, the third transmission path 64 between the specific terminal 60 and the flip-flop 56, and the load 65 on the third transmission path 64 will be determined in accordance with the embodiment of the present invention.

Furthermore, according to the method 600 of the present embodiment, after the first encountered flip-flop (i.e., the flip-flop 56) is found by searching from the signal input port 52 toward inside of the netlist file 66, a first candidate path and a second candidate path between the signal input port 52 and the data terminal D of the flip-flop 56 are found in a way similar to that employed in the first embodiment. Next, a common path of the first candidate path and the second candidate path will be designated as the first transmission path 58, and the load on the common path will be designated as the load 59 on the first transmission path 58 according to the method 600 of the present embodiment. Hence, through cross-comparing the first candidate path with the second candidate path by using the method similar to that employed in the first embodiment, the common path is then obtained, thereby concluding the total load seen by an input signal transmitted from the signal input port 52 to the data terminal D of the flip-flop 56. Similarly, according to the method 600, a third candidate path and a fourth candidate path between the signal output port 54 and the specific terminal 60 are found in a way similar to that employed in the first embodiment. Next, according to the method 600 of the present invention, a common path of the third candidate path and the fourth candidate path will be designated as the second transmission path 62, and the load on the common path will be designated as the load 63 on the second transmission path 62. Hence, through cross-comparing the third candidate path with the fourth candidate path by using the method similar to that employed in the first embodiment, the common path is then obtained, thereby concluding the total load seen by a clock signal transmitted from the specific terminal 60 to the signal output port 54. In addition, according to the method 600 of the present embodiment, a fifth candidate path and a sixth candidate path between the specific terminal 60 and the clock terminal C of the flip-flop 56 are found in a way similar to that employed in the first embodiment. Next, according to the method 600 of the present embodiment, a common path of the fifth candidate path and the sixth candidate path will be designated as the third transmission path 64, and the load on the common path will be designated as the load 65 on the third transmission path 64. Hence, through cross-comparing the fifth candidate path with the sixth candidate path by using the method similar to the first embodiment, the common path is then obtained, thereby concluding the total load seen by a clock signal transmitted from the specific terminal 60 to the clock terminal C of the flip-flop 56.

Next, in step 610, the first transmission path 58, the load 59, the second transmission path 62, the load 63, the third transmission path 64, and the load 65 are automatically extracted by the method 600 of the present embodiment to generate the interface circuit file 69 of the integrated circuit 50. After that, in the step 612, the method 600 of the present embodiment utilizes the simplified interface circuit file 69 for calculating the signal transmission time T5 of the first transmission path 58, the clock transmission time T6 of the second transmission path 62, and the clock transmission time T7 of the third transmission path 64. After the signal transmission time T5 of the first transmission path 58, the clock transmission time T6 of the second transmission path 62, and the clock transmission time T7 of the third transmission path 64 are calculated, an accurate timing model will be established through applying the results of the delay time to the timing model of the integrated circuit 50 by utilizing a specific program. In the end, the chip developer will obtain a sufficiently precise timing model.

According to the aforementioned embodiment, the method 600 of the present invention utilizes the simplified interface circuit file 69 and a computer for allowing the signal transmission time T5 of the first transmission path 58, the clock transmission time T6 of the second transmission path 62, and the clock transmission time T7 of the third transmission path 64 to be obtained through simulation. Therefore, comparing with the conventional process (e.g., finding out the signal transmission time T5 of the first transmission path 58, the clock transmission time T6 of the second transmission path 62, and the clock transmission time T7 of the third transmission path 64 from a whole chip simulation accomplished by directly using the entire netlist file 66 of the integrated circuit 50), the method 600 of the present invention can calculate the interface timing constraint information of the integrated circuit 50 faster and more accurately.

Please note that, as steps 602 and 604 are similar to steps 202 and 204 respectively, the details are omitted here for brevity.

Figure 7:
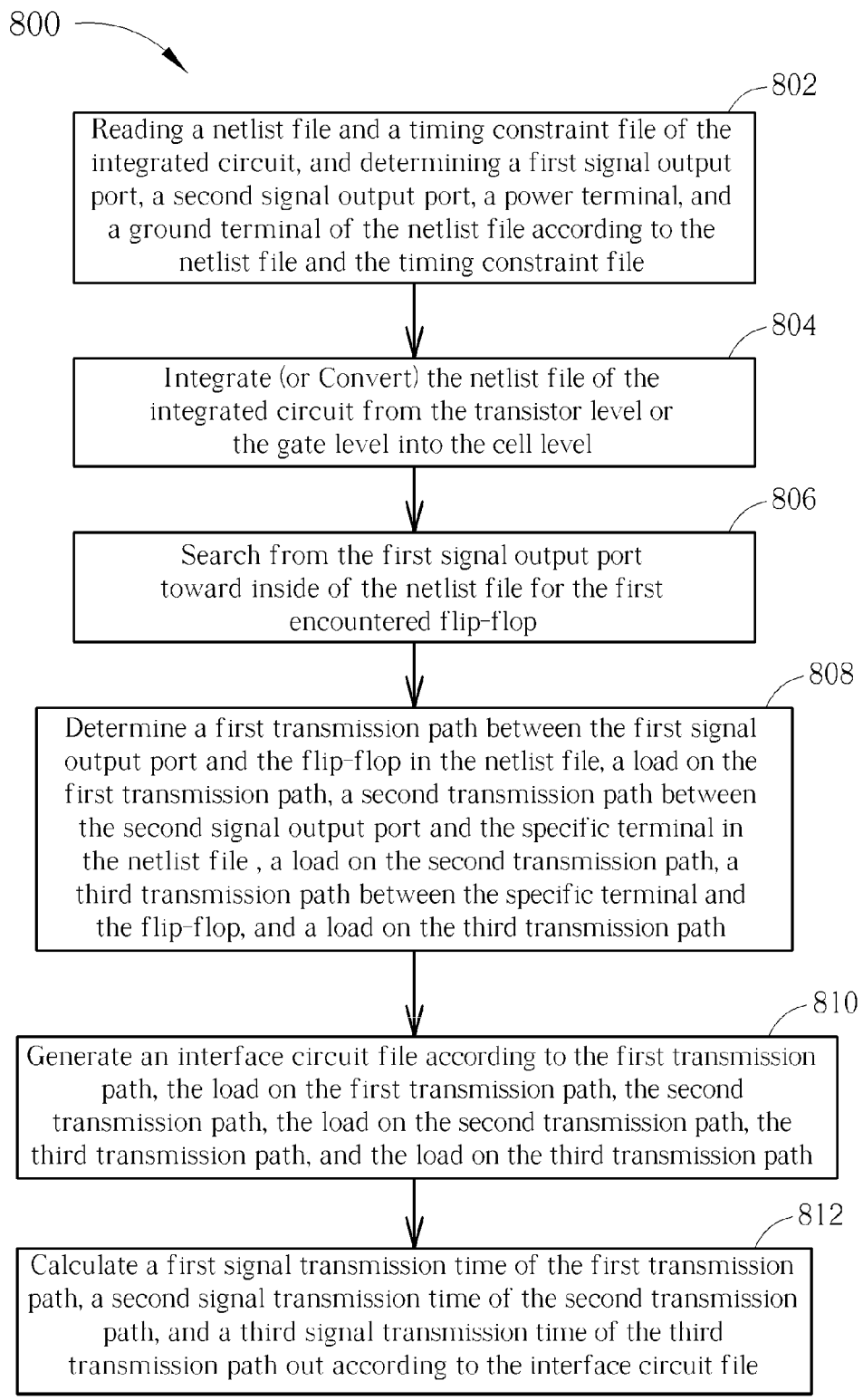
FIG. 7 is a flowchart illustrating a method for determining an interface timing of an integrated circuit according to a fourth embodiment of the present invention.
Figure 8:
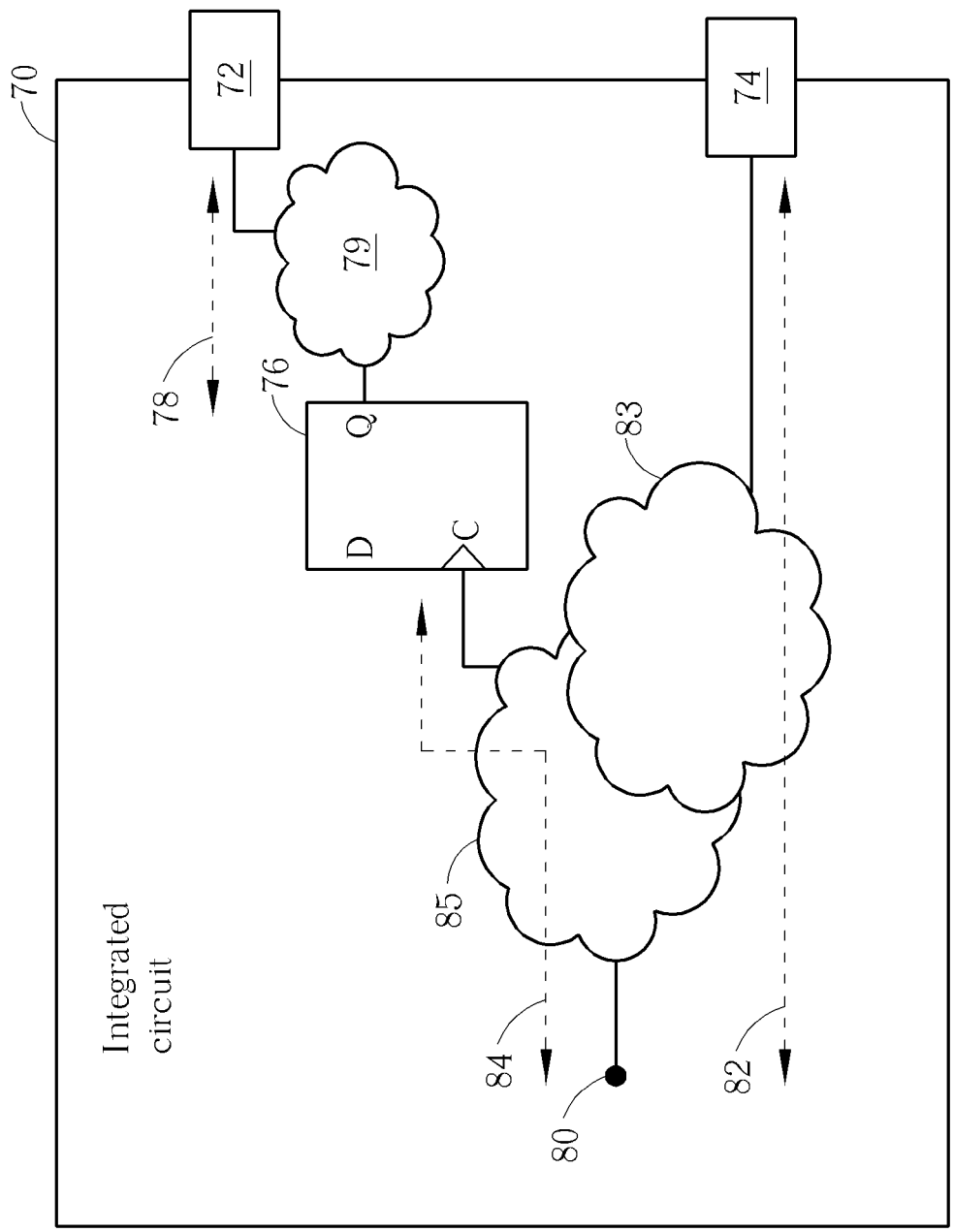
FIG. 8 is a diagram illustrating the integrated circuit according to an exemplary embodiment of the present invention.

Please refer to FIG. 7 and FIG. 8. FIG. 7 is a flowchart illustrating a method 800 for determining an interface timing of an integrated circuit 70 according to a fourth embodiment of the present invention. FIG. 8 is a diagram illustrating the integrated circuit 70 according to an exemplary embodiment of the present invention. Please note that, for the sake of simplicity, FIG. 8 only shows a first signal output port 72, a second signal output port 74, a flip-flop 76, a first transmission path 78 where a data signal passes from the first signal output port 72 to the flip-flop 76, a load 79 on the first transmission path 78, a second transmission path 82 where a clock signal passes from the second signal output port 74 to a specific terminal 80 in the integrated circuit 70, a load 83 on the second transmission path 82, a third transmission path 84 where a clock signal passes from the specific terminal 80 to the flip-flop 76, and a load 85 on the third transmission path 84, wherein the load 83 may partly overlap with the load 85. Provided that substantially the same result is achieved, the steps in FIG. 7 need not be in the exact order shown and need not be contiguous, that is, other steps can be intermediate. Besides, some steps in FIG. 7 may be omitted according to various types of embodiments or requirements. In this embodiment, the method 800 includes the following steps.

Step 802: Reading a netlist file 86 and a timing constraint file 88 of the integrated circuit 70, and determining a first signal output port 72, a second signal output port 74, a power terminal, and a ground terminal of the netlist file 86 according to the netlist file 86 and the timing constraint file 88;

Step 804: Integrate (or Convert) the netlist file 86 of the integrated circuit 70 from the transistor level or the gate level into the cell level;

Step 806: Search from the first signal output port 72 toward inside of the netlist file 86 for the first encountered flip-flop 76;

Step 808: Determine a first transmission path 78 between the first signal output port 72 and the flip-flop 76 in the netlist file 86, a load 79 on the first transmission path 78, a second transmission path 82 between the second signal output port 74 and the specific terminal 80 in the netlist file 86, a load 83 on the second transmission path 82, a third transmission path 84 between the specific terminal 80 and the flip-flop 76, and a load 85 on the third transmission path 84;

Step 810: Generate an interface circuit file 89 according to the first transmission path 78, the load 79 on the first transmission path 78, the second transmission path 82, the load 83 on the second transmission path 82, the third transmission path 84, and the load 85 on the third transmission path 84

Step 812: Calculate a first signal transmission time T8 of the first transmission path 78, a second signal transmission time T9 of the second transmission path 82, and a third signal transmission time T10 of the third transmission path 84 out according to the interface circuit file 89.

Please note that the only difference between the integrated circuit 70 shown in FIG. 8 and the integrated circuit 50 shown in FIG. 6 is the arrangement/location of the flip-flop inside the integrated circuit coupled to the data terminal. Specifically, the signal input port 52 of the integrated circuit 50 shown in FIG. 6 is coupled to the data input terminal D of the flip-flop 56, while the signal output port 72 of the integrated circuit 70 shown in FIG. 8 is coupled to the data output port Q of the flip-flop 76. Those skilled in the art will readily understand the disclosed technique content of FIG. 7 and FIG. 8 after reading the disclosed technique content of FIG. 5 and FIG. 6. Therefore, the details are omitted here for brevity. In short, as the integrated circuit 70 receives no external clock signals, the integrated circuit 70 utilizes an internal clock generator (e.g., a phase-locked loop) to generator clock signals for internal use. Moreover, the clock generator may generate the clock signal based on a received data signal. Hence, the specific terminal 80 of the integrated circuit 70 could be regarded as an output terminal of the clock generator. After the specific terminal 80 is determined, the first signal transmission time T8 of the first transmission path 78, the second signal transmission time T9 of the second transmission path 82, and the third signal transmission time T10 of the third transmission path 84 will be calculated in accordance with the method of the aforementioned embodiments. Hence, compared with the conventional method, the method 800 of the present invention can obtain the interface timing constraint information of the integrated circuit 70 more rapidly and more accurately.

Please note that, although the aforementioned embodiments illustrate the way to find out the transmission timing constraint of the output interface and the input interface of an integrated circuit respectively, those skilled in the art may employ the methods of the aforementioned embodiments jointly to find out all of the combinations of the transmission timing constraints between the output interface and the input interface of an integrated circuit. This also belongs to the scope of the present invention.

Figure 9:
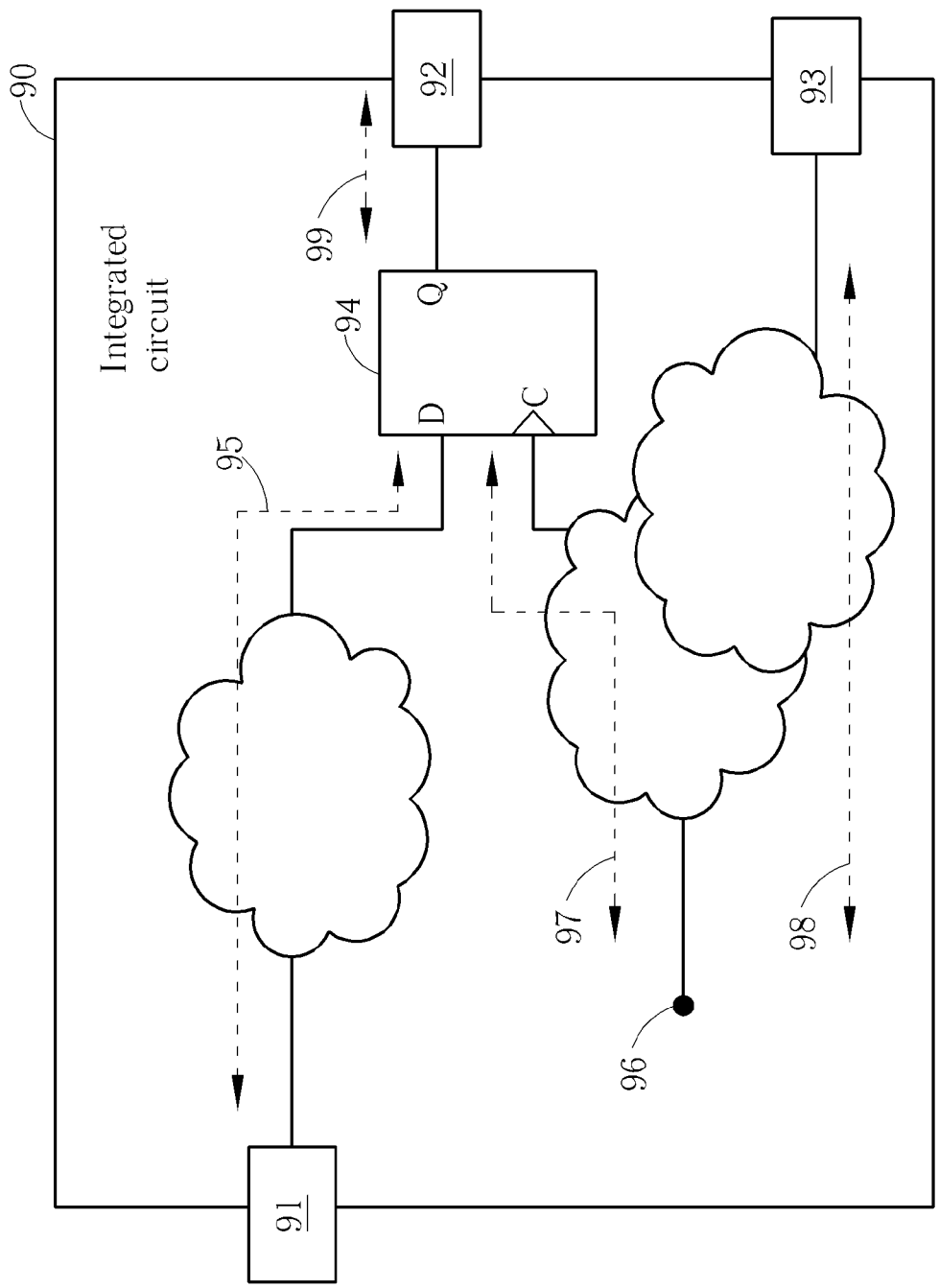
FIG. 9 is a diagram illustrating an integrated circuit according to an embodiment of the present invention.

Please refer to FIG. 9, which is a diagram illustrating an integrated circuit 90 according to an embodiment of the present invention. Please note that, for the sake of simplicity, FIG. 9 only shows a signal input port 91, a first signal output port 92, a second signal output port 93, a flip-flop 94, a first transmission path 95 where a data signal passes from the signal input port 91 to the data input terminal D of the flip-flop 94, a load on the first transmission path 95, a second transmission path 97 where a clock signal passes from a specific terminal 96 to the clock terminal C of the flip-flop 94, a load on the second transmission path 97, a third transmission path 98 where a clock signal passes from the specific terminal 96 to the second signal output port 93, a load on the third transmission path 98, a fourth transmission path 99 where a data signal passes from the data output terminal Q of the flip-flop 94 to the first signal output port 92, and a load on the fourth transmission path 99, wherein the specific terminal 96 is an output terminal of a internal clock generator (e.g., a phase-locked loop) inside the integrated circuit 90 for outputting a clock signal generated based on a received data signal. Therefore, a data transmission time T11, a clock transmission time T12, a clock transmission time T13, and a data transmission time T14 respectively corresponding to the first transmission path 95, the second transmission path 97, the third transmission path 98, and the fourth transmission path 99 can be calculated accordingly based on the teachings of the aforementioned embodiments. Furthermore, the delay time Td and the timing constraint Tc of the integrated circuit 90 shown in FIG. 9 can be calculated from the following equations (1) and (2).

$$Td = (T12 + T14) - T13 \quad (1)$$

$$Tc = T15 + T13 \quad (2)$$

where T15 is the time difference which the input data takes from the signal input port 91, through T11, till arriving the specific terminal 96, through T12.

Figure 10:
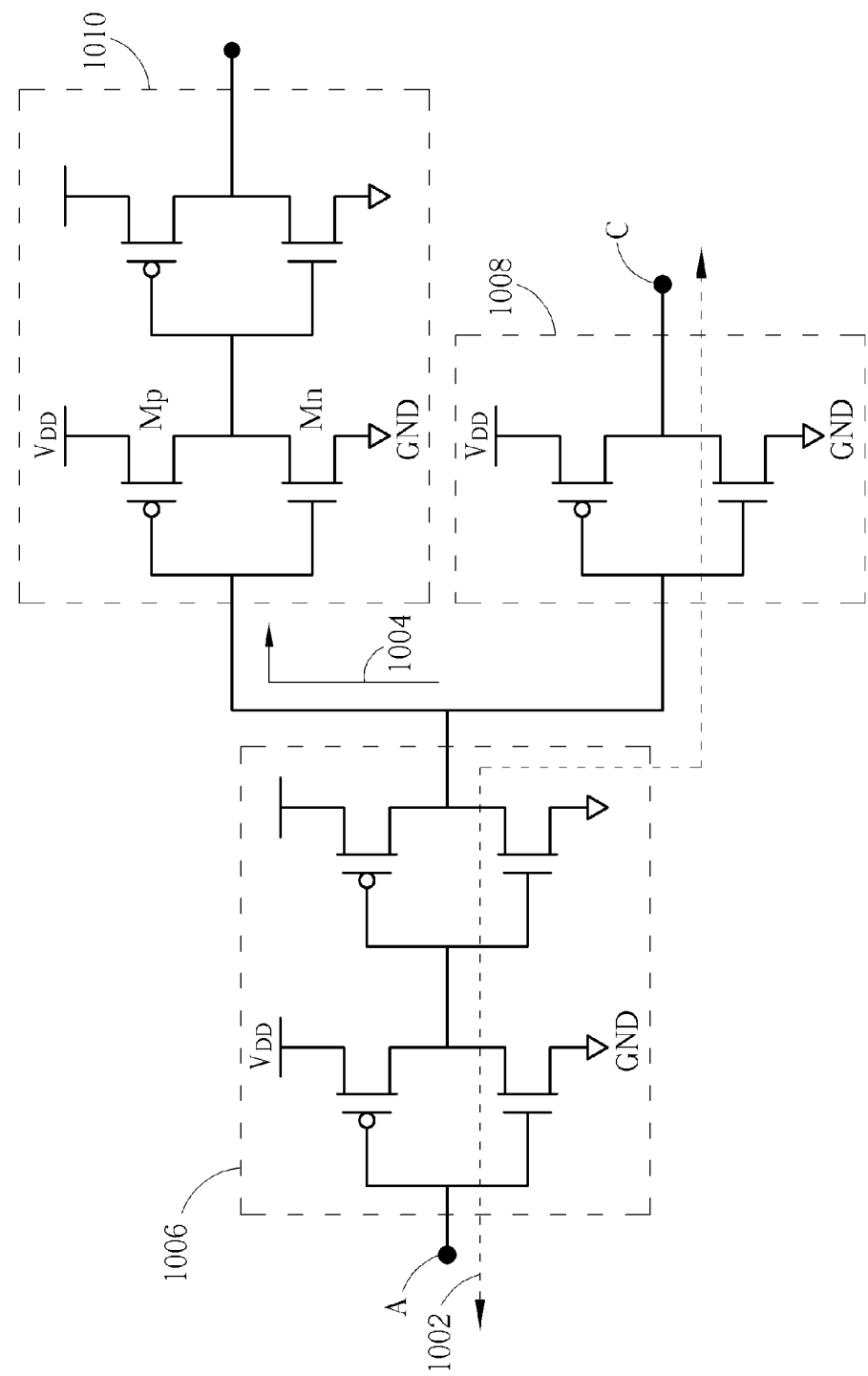
FIG. 10 is a diagram illustrating how to determine a load on a transmission path according to a first embodiment of the present invention.
Figure 11:
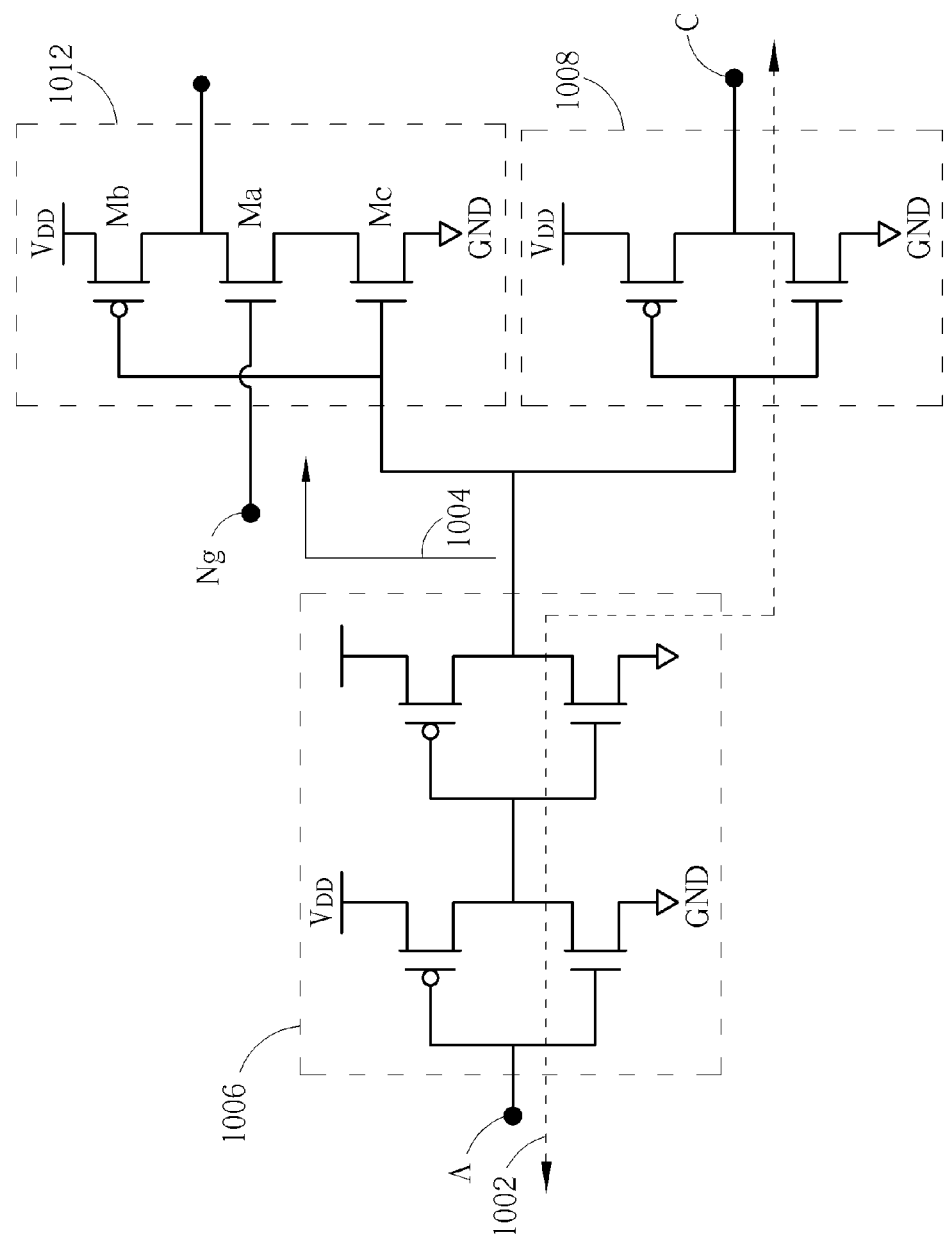
FIG. 11 is a diagram illustrating how to determine a load on a transmission path according to a second embodiment of the present invention.

In addition, as the above-mentioned embodiments all disclose the technical feature regarding how to determine a transmission path and a load on the transmission path, another embodiment of the present invention will give teachings regarding how to determine a load on a transmission path, as shown in FIG. 10. FIG. 10 is a diagram illustrating how to determine a load 1004 on a transmission path 1002 according to a first embodiment of the present invention. As can be seen in FIG. 10, if a signal is transmitted from a terminal A to a terminal C, then the circuit elements 1006, 1008, and the branch circuit element 1010 on the transmission path 1002 are extracted according to the above-mentioned embodiments, wherein the circuit element 1006 is represented by two cascaded inverters, the circuit element 1008 is represented by a single inverter, and the circuit element 1010 is represented by two cascaded inverters. Next, the inverters of the circuit elements 1006, 1008, 1010 will be converted from the cell level to the transistor level, and the power terminal and the ground terminal are connected to the corresponding supply voltages (e.g., the supply voltage VDD or the ground voltage GND). Therefore, when the transmission time needed by a signal to be transmitted from the terminal A to the terminal C is calculated based on the method of the aforementioned embodiment, the circuit element 1010 is regarded as a load, which is the capacitance seen by the gate terminal of the two transistors Mp and Mn. If a gate terminal of the circuit element 1010 is floating, the gate terminal should be coupled to a voltage level to allow the transistor to remain turned on. In this way, the load induced by the circuit element 1010 will be more close to the load on the transmission path 1002 in a practical operation. For example, please refer to FIG. 11, which is a diagram illustrating how to determine a load 1004 on a transmission path 1002 according to a second embodiment of the present invention. As can be seen in FIG. 11, if a branch circuit 1012 coupled to the transmission path 1002 is composed of the transistors Ma, Mb, and Mc shown in FIG. 11, the gate terminal Ng of the transistor Ma of the branch circuit 1012 may become floating after the branch circuit 1012 is connected to the corresponding supply voltage (e.g., the supply voltage VDD or the ground voltage GND). Hence, the gate terminal Ng is coupled to a voltage level (e.g., the supply voltage VDD) to allow the transistor to remain turned on according to the aforementioned embodiment. In this way, the load induced by the circuit element 1012 will be more close to the load on the transmission path 1002 in a practical operation.

It should be noted that, when an interface circuit file is extracted for computing the signal transmission time of the transmission path inside the interface circuit file (e.g., the steps 210, 212 of the first embodiment, the steps 410, 412 of the second embodiment, the steps 610, 612 of the third embodiment, and the steps 810, 812 of the fourth embodiment), the interface circuit file (e.g., the interface circuit file 26 of the first embodiment, the interface circuit file 46 of the second embodiment, the interface circuit file 69 of the third embodiment, and the interface circuit file 89 of the fourth embodiment) will be further converted from the cell level to the transistor level, and the power terminal and the ground terminal will be connected to the corresponding supply voltages (e.g., the supply voltage VDD and the ground voltage GND). This is because the processor for executing the above-mentioned embodiments can not identify the connection terminal of each transistor of the interface circuit under the cell level, thus failing to connect the connection terminal of each transistor in the interface circuit file to the correct voltage level. In other words, after the interface circuit file is converted to the transistor level, the connection terminal of each transistor will be connected to the accurate voltage level for computing the signal transmission time of each transmission path in the interface circuit file 69 accordingly.

Figure 12:
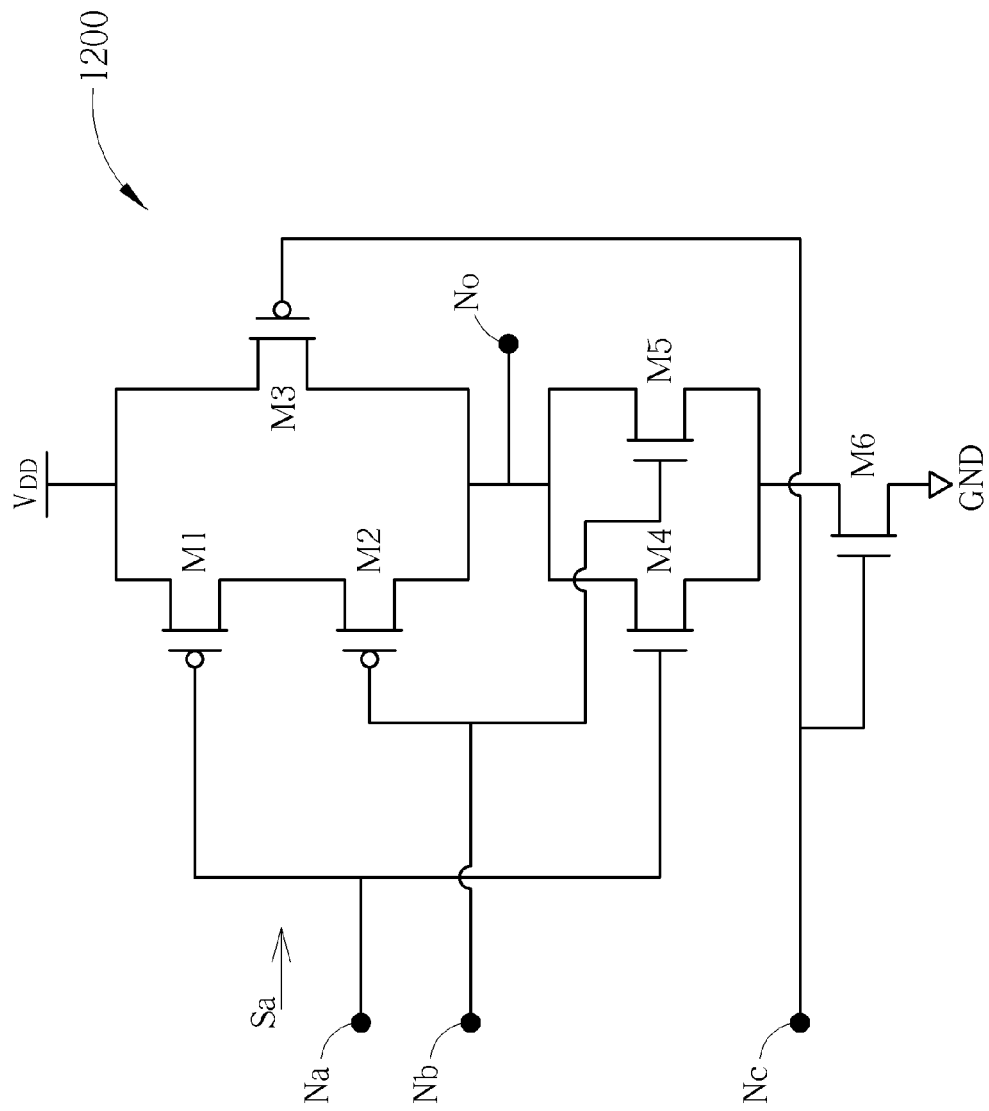
FIG. 12 is a diagram illustrating an interface circuit file under the transistor level according to an embodiment of the present invention.

For instance, please refer to FIG. 12, which is a diagram illustrating an interface circuit file 1200 under the transistor level according to an embodiment of the present invention. The interface circuit file 1200 includes 6 transistors M1, M2, M3, M4, M5, and M6. If a testing signal Sa is transmitted via a transmission path from the terminal Na to No, then the gate terminal Nb of the transistors M2 and M5 has to be connected to a low voltage level (e.g., the ground voltage GND) to turn on the transistor M2 and turn off the transistor M5; in addition, the gate terminal Nc of the transistors M3 and M6 have to be connected to a high voltage level (e.g., the supply voltage VDD) to turn off the transistor M3 and turn on the transistor M6. In other words, in order to allow the testing signal Sa to transmit from the terminal Na to No for obtaining a signal transmission time of the transmission path, the path between the output terminal No and the supply voltage VDD cannot be totally conducted, and the path between the output terminal No and the ground voltage GND can not be totally conducted as well. Also, as can be seen from FIG. 12, if a transistor is connected in series with the transistor which is used for receiving the test signal Sa, then the transistor has to be turned on for allowing the signal transmission time to be measured out; and if a transistor is connected in parallel with the transistor which is used for receiving the test signal Sa, then the transistor has to be turned off for allowing the signal transmission time to be measured out.

In addition, an embodiment of the present invention further provides a non-transitory machine readable medium which stores a program code, wherein when the program code is loaded and executed by a processor, the program code enables the processor to perform the steps 202-212 of the disclosed method 200, the steps 402-412 of the disclosed method 400, the steps 602-612 of the disclosed method 600, and/or the steps 802-812 of the disclosed method 800 to calculate out the interface timing relationship of an integrated circuit (e.g., the delay time and the timing constraint of the interface).

In summary, the teachings of the embodiments of the present invention allow a transmission path and the branch circuit on the transmission path to be extracted at the same time while extracting a netlist file of an integrated circuit, thereby generating a simplified interface circuit file accordingly. Therefore, according to the embodiments of the present invention, the interface timing constraint of the integrated circuit is able to be obtained more rapidly and accurately through performing simulation upon the simplified interface circuit file.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for determining an interface timing of an integrated circuit, comprising:
    reading a netlist file and a timing constraint file of the integrated circuit, and determining a first interface port of the netlist file according to the netlist file and the timing constraint file;
    searching from the first interface port toward inside of the netlist file for the first flip-flop as a specific circuit element, and designating a path coupled between the first interface port and the first flip-flop as a first candidate path;
    backtracking from the first flip-flop toward the first interface port for finding out a path coupled between the first interface port and the first flip-flop, and designating the path as a second candidate path;
    cross-comparing the first candidate path with the second candidate path to obtain a common path;
    designating the common path as a first transmission path, and designating load on the common path as a load on the first transmission path;
    generating an interface circuit file according to the first transmission path and the load on the first transmission path; and
    using a computer to calculate a first signal transmission time of the first transmission path according to the interface circuit file.

2. The method of claim 1, wherein the step of calculating the first signal transmission time of the first transmission path according to the interface circuit file comprises:
    converting the interface circuit file from a cell level interface circuit file into a gate level interface circuit file.

3. The method of claim 1, further comprising:
    searching from the first interface port toward inside of the netlist file for the first flip-flop as the specific circuit element.

4. The method of claim 1, wherein the first interface port is one of a data signal input terminal, a clock signal input terminal, a data signal output terminal, and a clock signal output terminal.

5. The method of claim 1, further comprising:
    determining a second interface port of the netlist file according to the netlist file and the timing constraint file;
    determining a second transmission path and a load on the second transmission path between the second interface port and the specific circuit element;
wherein the step of generating the interface circuit file according to the first transmission path and the load on the first transmission path comprises:
    generating the interface circuit file according to the first transmission path, the load on the first transmission path, the second transmission path, and the load on the second transmission path;
wherein the step of calculating the first signal transmission time of the first transmission path according to the interface circuit file further comprises:
    calculating a second signal transmission time of the second transmission path according to the interface circuit file.

6. The method of claim 5, wherein the step of determining the second transmission path and the load on the second transmission path between the second interface port and the specific circuit element comprises:
    searching from the second interface port toward inside of the netlist file for the specific circuit element, and designating a path coupled between the second interface port and the specific circuit element as a first candidate path;
    backtracking from the specific circuit element toward the second interface port for finding out the path coupled between the second interface port and the specific circuit element, and designating a path coupled between the second interface port and the specific circuit element as the second candidate path; and
    designating a common path of the first candidate path and the second candidate path as the second transmission path, and designating a load on the common path as the load on the second transmission path.

7. The method of claim 5, wherein one of the first interface port and the second interface port is a data signal input terminal, and another of the first interface port and the second interface port is a clock signal input terminal.

8. The method of claim 5, wherein the first interface port is a clock signal input terminal, and the second interface port is a data signal output terminal.

9. The method of claim 1, further comprising:
   determining a second interface port of the netlist file according to the netlist file and the timing constraint file;
   determining a second transmission path and a load on the second transmission path between the second interface port and a specific terminal in the netlist file;
   determining a third transmission path and a load on the third transmission path between the specific terminal and the specific circuit element;
wherein the step of generating the interface circuit file according to the first transmission path and the load on the first transmission path comprises:
   generating the interface circuit file according to the first transmission path, the load on the first transmission path, the second transmission path, the load on the second transmission path, the third transmission path, and the load on the third transmission path;
wherein the step of calculating the first signal transmission time of the first transmission path according to the interface circuit file further comprises:
   calculating a second signal transmission time of the second transmission path and a third signal transmission time of the third transmission path out according to the interface circuit file;
wherein the first interface port is a data signal input terminal, and the second interface port is a clock signal output terminal.

10. The method of claim 9, wherein the specific terminal is an internal clock generation terminal in the netlist file.

11. The method of claim 9, wherein the step of determining the second transmission path and the load on the second transmission path between the second interface port and the specific terminal comprises:
   searching from the second interface port toward inside of the netlist file for the specific terminal, and designating a path coupled between the second interface port and the specific terminal as a first candidate path;
   backtracking from the specific terminal toward the second interface port for finding out a path coupled between the second interface port and the specific terminal, and designating the path as the second candidate path; and
   designating a common path of the first candidate path and the second candidate path as the second transmission path, and designating a load on the common path as the load on the second transmission path.

12. The method of claim 9, wherein the step of determining the third transmission path and the load on the third transmission path between the specific terminal and the specific circuit element comprises:
   searching from the specific terminal toward inside of the netlist file for the specific circuit element, and designating a path coupled between the specific terminal and the specific circuit element as a first candidate path;
   backtracking from the specific circuit element toward the specific terminal for finding out a path coupled between the specific circuit element and the specific terminal, and designating the path as a second candidate path; and
   designating a common path of the first candidate path and the second candidate path as the third transmission path, and designating a load on the common path as the load on the third transmission path.

13. The method of claim 10, wherein the specific terminal is an internal clock generation terminal in the netlist file.

14. The method of claim 1, further comprising:
   determining a second interface port of the netlist file according to the netlist file and the timing constraint file;
   determining a second transmission path and a load on the second transmission path between the second interface port and a specific terminal in the netlist file;
   determining a third transmission path and a load on the third transmission path between the specific terminal and the specific circuit element;
   determining a third interface port of the netlist file according to the netlist file and the timing constraint file;
   determining a fourth transmission path and a load on the fourth transmission path between the third interface port and the specific circuit element;
wherein the step of generating the interface circuit file according to the first transmission path and the load on the first transmission path comprises:
   generating the interface circuit file according to the first transmission path, the load on the first transmission path, the second transmission path, the load on the second transmission path, the third transmission path, the load on the third transmission path, the fourth transmission path, and the load on the fourth transmission path;
wherein the step of calculating the first signal transmission time of the first transmission path according to the interface circuit file further comprises:
   calculating a second signal transmission time of the second transmission path, a third signal transmission time of the third transmission path, and a fourth signal transmission time of the fourth transmission path out according to the interface circuit file;
wherein the first interface port is a data signal output terminal, the second interface port is a clock signal output terminal, and the third interface port is a data signal input terminal.

15. The method of claim 14, wherein the step of determining the second transmission path and the load on the second transmission path between the second interface port and the specific terminal comprises:
   searching from the second interface port toward inside of the netlist file for the specific terminal, and designating a path coupled between the second interface port and the specific terminal as a first candidate path;
   backtracking from the specific terminal toward the second interface port for finding out a path coupled between the second interface port and the specific terminal, and designating the path as a second candidate path; and
   designating a common path of the first candidate path and the second candidate path as the second transmission path, and designating a load on the common path as the load on the second transmission path.

16. The method of claim 14, wherein the step of determining the third transmission path and the load on the third transmission path between the specific terminal and the specific circuit element comprises:
   searching from the specific terminal toward inside of the netlist file for the specific circuit element, and designating a path coupled between the specific terminal and the specific circuit element as a first candidate path;
   backtracking from the specific circuit element toward the specific terminal for finding out a path coupled between the specific circuit element and the specific terminal, and designating the path as a second candidate path; and designating a common path of the first candidate path and the second candidate path as the third transmission path, and designating a load on the common path as the load on the third transmission path.

17. The method of claim 14, wherein the step of determining the fourth transmission path and the load on the fourth transmission path between the third interface port and the specific circuit element comprises:

searching from the third interface port toward inside of the netlist file for the specific circuit element, and designating a path coupled between the third interface port and the specific circuit element as a first candidate path;

backtracking from the specific circuit element toward the third interface port for finding out a path coupled between the third interface port and the specific circuit element, and designating the path as a second candidate path; and designating a common path of the first candidate path and the second candidate path as the fourth transmission path, and designating a load on the common path as the load on the fourth transmission path.

18. A non-transitory machine readable medium having a program code stored therein, wherein when executed by a processor, the program code enables the processor to perform following steps:

reading a netlist file and a timing constraint file of the integrated circuit, and determining a first interface port of the netlist file according to the netlist file and the timing constraint file;

searching from the first interface port toward inside of the netlist file for the first flip-flop as a specific circuit element, and designating a path coupled between the first interface port and the first flip-flop as a first candidate path;

backtracking from the first flip-flop toward the first interface port for finding out a path coupled between the first interface port and the first flip-flop, and designating the path as a second candidate path;

cross-comparing the first candidate path with the second candidate path to obtain a common path;

designating the common path as a first transmission path, and designating load on the common path as a load on the first transmission path;

generating an interface circuit file according to the first transmission path and the load on the first transmission path; and calculating a first signal transmission time of the first transmission path according to the interface circuit file.

19. The non-transitory machine readable medium of claim 18, wherein the program code further enables the processor to perform following steps:

determining a second interface port of the netlist file according to the netlist file and the timing constraint file;

determining a second transmission path and a load on the second transmission path between the second interface port and the specific circuit element;

wherein the step of generating the interface circuit file according to the first transmission path and the load on the first transmission path comprises:

generating the interface circuit file according to the first transmission path, the load on the first transmission path, the second transmission path, and the load on the second transmission path;

wherein the step of calculating the first signal transmission time of the first transmission path out according to the interface circuit file further comprises:

calculating a second signal transmission time of the second transmission path according to the interface circuit file.

* * * * *